United States Patent
Kikuchi et al.

(10) Patent No.: US 10,443,957 B2
(45) Date of Patent: Oct. 15, 2019

(54) COOLING PLATE AND INFORMATION PROCESSING DEVICE

(71) Applicant: FUJITSU LIMITED, Kawasaki-shi, Kanagawa (JP)

(72) Inventors: Shunichi Kikuchi, Yokohama (JP); Yoshihisa Iwakiri, Kawasaki (JP); Naoaki Nakamura, Kawasaki (JP); Takayoshi Matsumura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/110,159

(22) Filed: Aug. 23, 2018

(65) Prior Publication Data

US 2019/0093964 A1   Mar. 28, 2019

(30) Foreign Application Priority Data

Sep. 27, 2017   (JP) .................................. 2017-186497

(51) Int. Cl.
*H05K 7/20* (2006.01)
*F28F 3/12* (2006.01)
(Continued)

(52) U.S. Cl.
CPC .............. *F28F 3/12* (2013.01); *F28F 9/0204* (2013.01); *F28F 9/0221* (2013.01);
(Continued)

(58) Field of Classification Search
CPC . H01L 23/473; H01L 23/4735; H01L 23/467; H01L 23/3672; H01L 21/4882;
(Continued)

(56) References Cited

U.S. PATENT DOCUMENTS 5,170,319 A * 12/1992 Chao-Fan Chu ... H01L 23/4338
165/170
7,156,159 B2 * 1/2007 Lovette ..................... F28F 3/12
165/104.33
(Continued)

FOREIGN PATENT DOCUMENTS

| JP | 2000-260916 | 9/2000 |
| JP | 2003-60145 | 2/2003 |
| JP | 2006-310485 | 11/2006 |

OTHER PUBLICATIONS

English abstract for Japanese Patent Publication No. 2003-60145, published Feb. 28, 2003.
(Continued)

*Primary Examiner* — Adam B Dravininkas

(74) *Attorney, Agent, or Firm* — Staas & Halsey LLP

(57) ABSTRACT

A cooling plate that includes: a plate that is attached to a heat generating element; feed flow paths and return flow paths for coolant that are alternatingly arranged along a plate face of the plate; and a plurality of coolant flow paths that are formed in a plurality of levels within the plate closer to the heat generating element than the feed flow paths and the return flow paths, the plurality of coolant flow paths placing adjacent paths of the feed flow paths and the return flow paths in parallel communication through each of the levels.

10 Claims, 14 Drawing Sheets

(51) Int. Cl.
  H01L 23/473 (2006.01)
  G06F 1/20 (2006.01)
  F28F 9/02 (2006.01)
  F28D 1/02 (2006.01)
  F28D 21/00 (2006.01)

(52) U.S. Cl.
  CPC .............. F28F 9/0278 (2013.01); G06F 1/20 (2013.01); H05K 7/20254 (2013.01); H05K 7/20772 (2013.01); F28D 2001/0266 (2013.01); F28D 2021/0029 (2013.01); F28F 2009/0297 (2013.01); F28F 2210/08 (2013.01); H01L 23/473 (2013.01)

(58) Field of Classification Search
  CPC ...... F28F 3/12; F28F 13/06; F28F 3/02; F28F 9/26; F28F 3/048; F28F 13/12; F28F 9/026; F28F 3/025; F28F 2260/02; G06F 1/20; H05K 7/20772; H05K 7/20927; H05K 7/20254; H05K 7/20781; H05K 7/20272; H05K 7/20218; H05K 7/20; H05K 7/20509; H05K 7/20763
  See application file for complete search history.

(56) References Cited

U.S. PATENT DOCUMENTS

2009/0314474 A1   12/2009  Kimbara et al.
2016/0366793 A1*  12/2016  Kikuchi ............. H05K 7/20781
2018/0098459 A1*  4/2018  Chainer ............. H05K 7/20254

OTHER PUBLICATIONS

Espacenet English abstract for Japanese Patent Publication No. 2006-310485, published Nov. 9, 2006.
English abstract for Japanese Patent Publication No. 2000-260916, published Sep. 22, 2000.

* cited by examiner

COOLING PLATE AND INFORMATION PROCESSING DEVICE

CROSS-REFERENCE TO RELATED APPLICATION

This application is based upon and claims the benefit of priority of the prior Japanese Patent Application No. 2017-186497, filed on Sep. 27, 2017, the entire contents of which are incorporated herein by reference.

FIELD

A certain aspect of the embodiments discussed herein is related to a cooling plate and an information processing device.

BACKGROUND

Electronic devices include various kinds of heat generating elements. For example, heat generating elements such as a central processing unit (CPU) or a graphics processing unit (GPU) are employed in electronic devices such as servers, super computers, and personal computers. To prevent heat generating elements from overheating, electronic devices in which a heat generating element is employed use various types of cooling mechanisms. Examples of such cooling mechanisms include air cooling systems and liquid cooling systems.

RELATED PATENT DOCUMENTS

Japanese Laid-Open Patent Publication No. 2003-60145
Japanese Laid-Open Patent Publication No. 2006-310485
Japanese Laid-Open Patent Publication No. 2000-260916

SUMMARY

According to an aspect of the embodiments, a cooling plate includes: a plate that is attached to a heat generating element; feed flow paths and return flow paths for coolant that are alternatingly arranged along a plate face of the plate; and a plurality of coolant flow paths that are formed in a plurality of levels within the plate closer to the heat generating element than the feed flow paths and the return flow paths, the plurality of coolant flow paths placing adjacent paths of the feed flow paths and the return flow paths in parallel communication through each of the levels.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Explanation follows regarding an exemplary embodiment. Note that the following exemplary embodiment is merely exemplary, and the technical scope of the present disclosure is not limited thereby.

Figure 1:
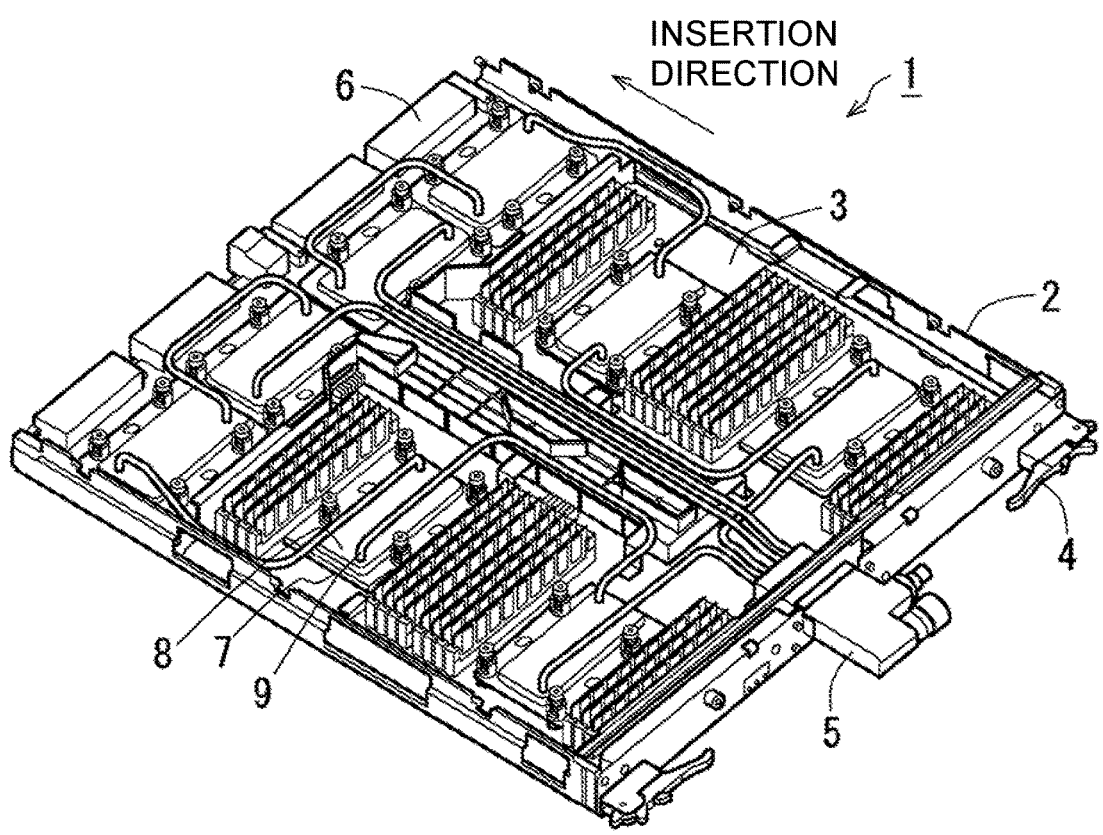
FIG. 1 illustrates a system board according to an exemplary embodiment.

FIG. 1 illustrates a system board according to an exemplary embodiment (this being an example of an information processing device in the present disclosure). System board 1 is an electronic component able to be installed in various kinds of electronic devices, for example a server or a supercomputer. The system board 1 includes a frame 2 that can be inserted into a slot provided to the electronic device to which the system board 1 is installed, and a wiring board 3 that is fixed inside the frame 2. Levers 4 for engaging the system board 1 with the slot are provided to the frame 2 at each end of a front side (non-insertion direction side) of the frame 2. A coolant inlet and outlet 5 is provided at a central portion of the front side of the frame 2. Connectors 6 are provided on the insertion direction side of the frame 2.

A CPU 7 (this being an example of a heat generating element in the present disclosure) is mounted on the wiring board 3. The CPU 7 is an electronic component that performs various kinds of arithmetic processing. The CPU 7 generates heat in amounts corresponding to its arithmetic processing load. A cooling plate 8 for cooling the CPU 7 is provided to the system board 1. The cooling plate 8 is a plate shaped member through which coolant flows, and is fixed to the surface of the CPU 7. The cooling plate 8 is connected to the coolant inlet and outlet 5 through coolant tubing 9.

Figure 2:
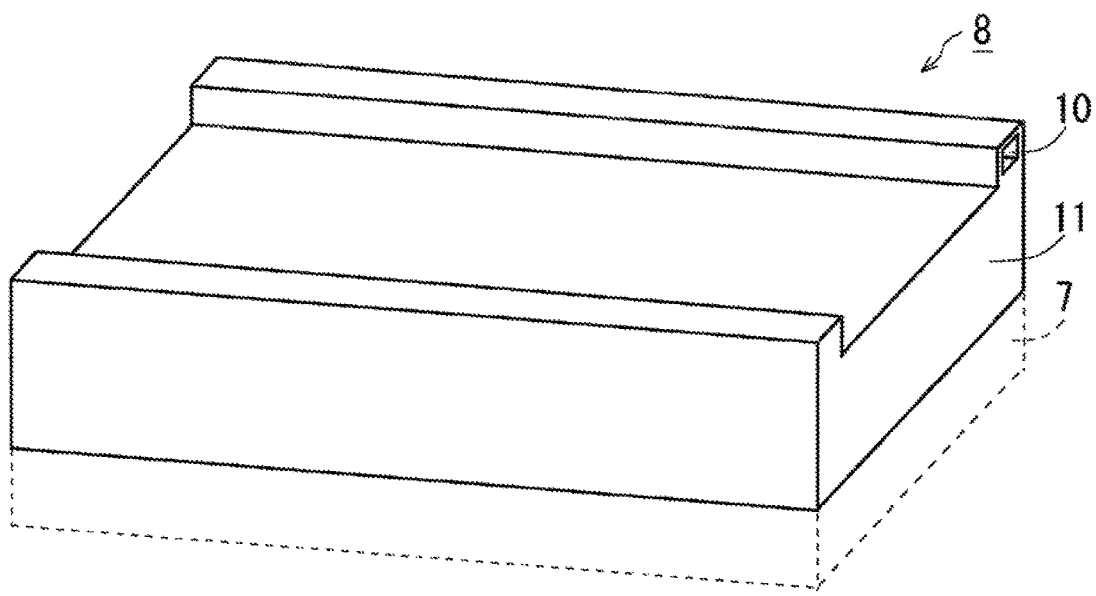
FIG. 2 is a simplified view of the outside of a cooling plate.
Figure 3:
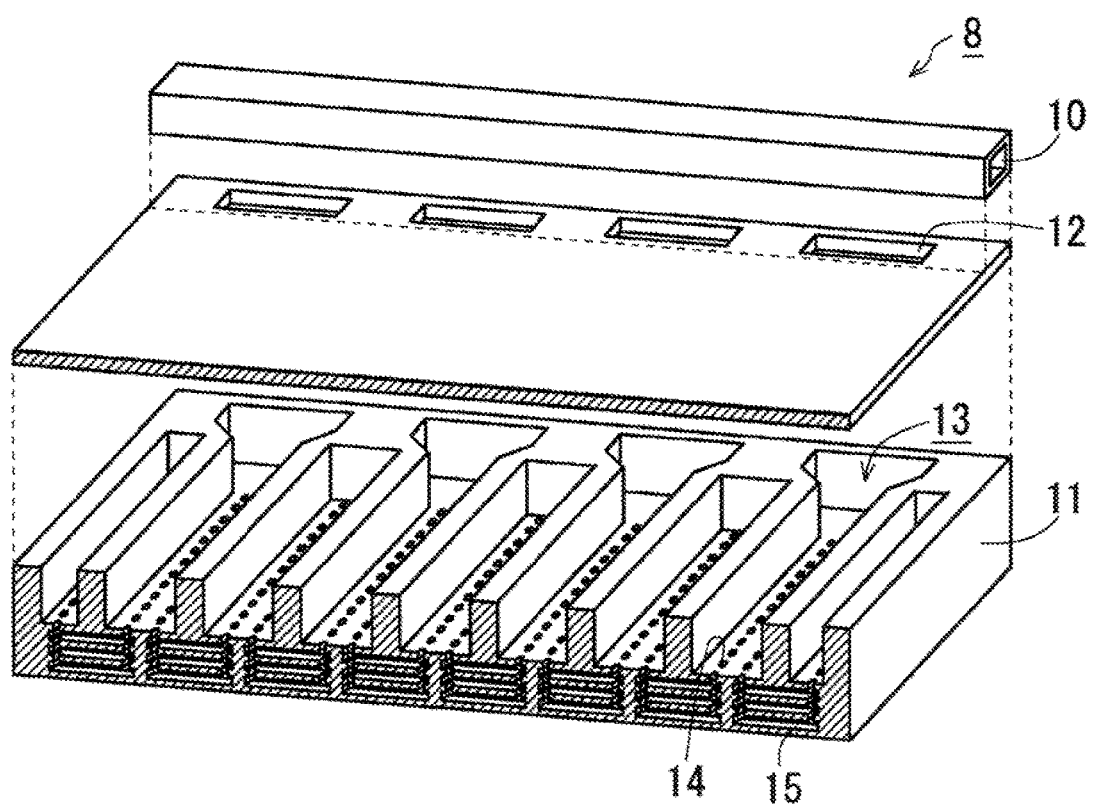
FIG. 3 is an exploded view illustrating the internal structure of a cooling plate.

FIG. 2 is a simplified view of the outside of the cooling plate 8. FIG. 3 is an exploded view illustrating the internal structure of the cooling plate 8. Although three components are illustrated in FIG. 3, the cooling plate 8 is not limited to this combination of components. The cooling plate 8 may be formed as a single unit made of a highly thermally conductive metal material, or, may be a combination of two or more such components.

The cooling plate 8 includes a rectangular plate 11 that is attached to the surface of the CPU 7. The cooling plate 8 also includes a first header 10 that is provided to an edge of the rectangular plate 11 and that is in communication with the coolant tubing 9. Second headers 13 that are in communication with the first header 10 via holes 12 are provided inside the plate 11. The second headers 13 are coolant flow paths that extend along a plate face of the plate 11. The second headers 13 are arranged inside the plate 11 in a state running parallel to one another so as to form alternating feed flow paths and return flow paths for coolant that run along the plate face of the plate 11. The first header 10 in communication with the plural second headers 13 thus functions as headers where coolant flowing in the second headers 13 splits off therefrom or merges thereinto.

Coolant flow paths 15 are provided to the plate 11. The coolant flow paths 15 are in communication with the second headers 13 via holes 14, and thereby link adjacent second headers 13 together. Plural of the holes 14 are provided to the second headers 13. The second headers 13 thus function as headers where coolant passing through the holes 14 splits off therefrom or merges thereinto.

Figure 4:
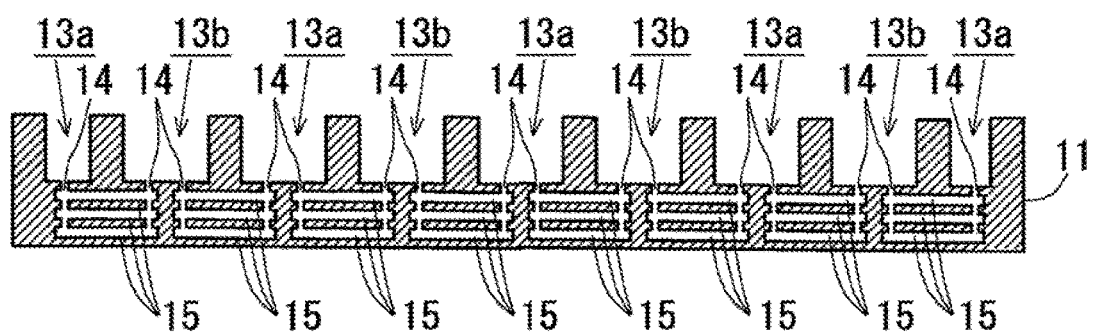
FIG. 4 is a schematic view of the cross-section structure of a plate.

FIG. 4 is a schematic view of a cross-section structure of the plate 11. In FIG. 4, of the plural second headers 13 provided running parallel to one another, the second headers 13 in communication with one end of the coolant flow paths 15 are labeled 13*a*, and the second headers 13 in communication with the other end of the coolant flow paths 15 are labeled 13*b*. The coolant flow paths 15 are formed within the plate 11 on the CPU 7 side of the than the second headers 13 (13*a*, 13*b*). The coolant flow paths 15 are very small coolant flow paths that extend along the plate face of the cooling plate 8. The coolant flow paths 15 are formed in plural levels within the plate 11 in sequence from the CPU 7 side of the plate 11. Coolant inlets and outlets at each end of the coolant flow paths 15 are in communication with the second headers 13*a*, 13*b* via the holes 14. The coolant thus passes through each of the coolant flow paths 15 in parallel.

Figure 5:
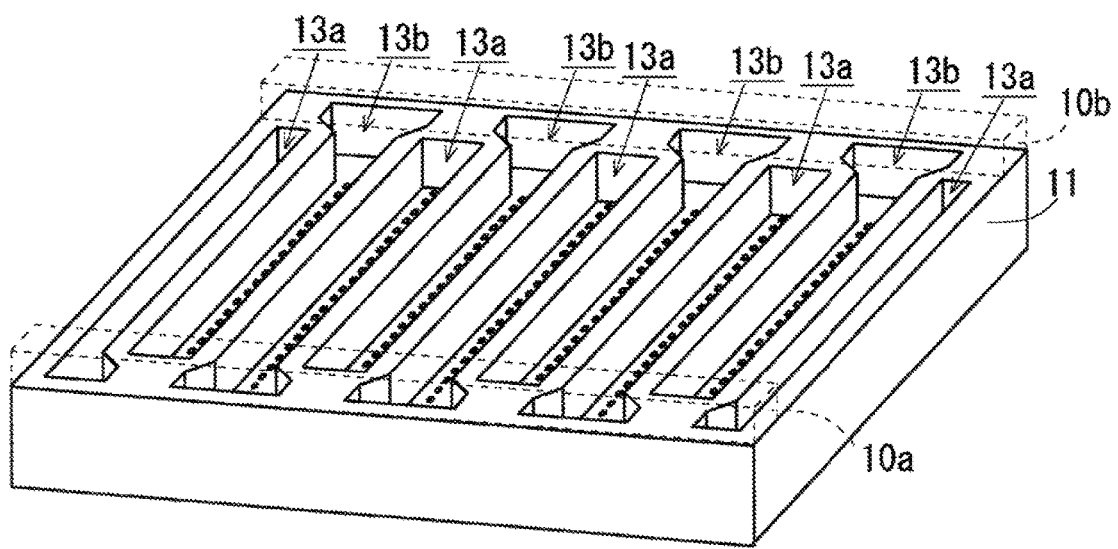
FIG. 5 is an overall depiction of the internal structure of a plate.

FIG. 5 is an overall depiction of the internal structure of the plate 11. In FIG. 5, of the two first headers 10 provided to the cooling plate 8, the first header 10 in communication with the second headers 13*a* is labeled 10*a*, and the first header 10 in communication with the second headers 13*b* is labeled 10*b*.

For example, in cases in which coolant is run through the cooling plate 8 such that coolant flows into the first header 10*a* from the coolant tubing 9 and coolant flows out from the first header 10*b* into the coolant tubing 9, coolant that has flowed into the first header 10*a* from the coolant tubing 9 flows into the holes 14 via the second headers 13*a*. Coolant that has passed through the holes 14 from the coolant flow paths 15 then flows to the first header 10*b* via the second headers 13*b*.

Further, for example, in cases in which coolant is run through the cooling plate 8 such that coolant flows into the first header 10*b* from the coolant tubing 9 and coolant flows out from the first header 10*a* into the coolant tubing 9, coolant that has flowed into the first header 10*b* from the coolant tubing 9 flows into the holes 14 via the second headers 13*b*. Coolant that has passed through the holes 14 from the coolant flow paths 15 then flows to the first header 10*a* via the second headers 13*a*.

In the cooling plate 8 formed as described above, heat from the CPU 7 is removed by the coolant passing through the coolant flow paths 15. Namely, heat from the CPU 7 is transferred through the components forming the cooling plate 8 to coolant flowing through each level of the coolant flow paths 15. The coolant flow paths 15 are formed so as to place the alternating feed flow paths and return flow paths for coolant formed by the second headers 13 along the plate face of the plate 11 in parallel communication through each of the levels, and so local imbalances in cooling ability within the plane making contact with the CPU 7 are not liable to occur in the cooling plate 8. The cooling plate 8 is thus able to evenly cool the CPU 7 over the entire plane contacting the CPU 7, providing a relatively high effective cooling ability.

As illustrated in the following modified examples, the coolant flow paths 15 in the plate 11 may be formed such that the cross-sectional areas thereof become larger the closer the level to the CPU 7.

Figure 6:
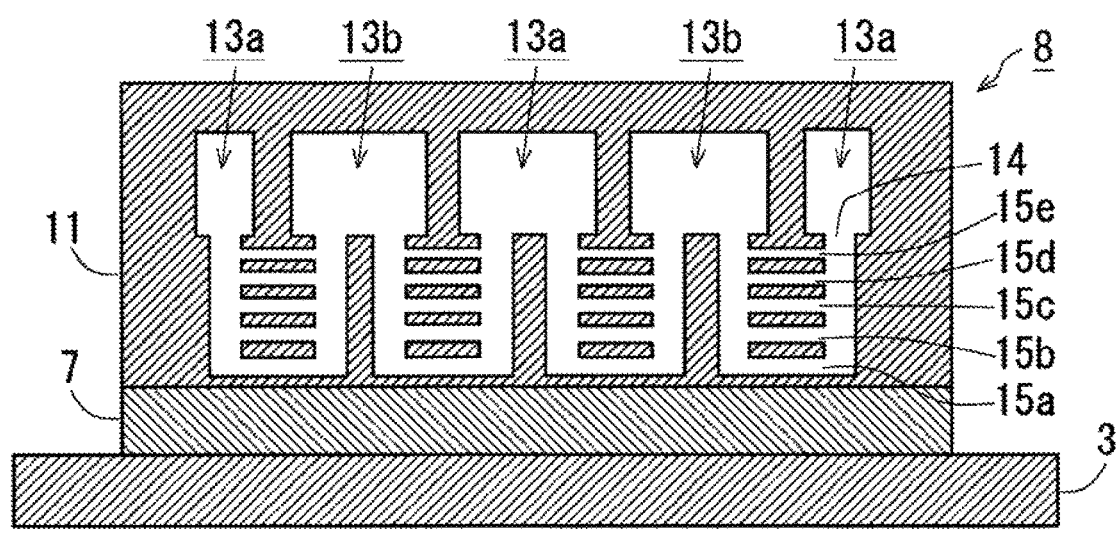
FIG. 6 illustrates a first modified example of a coolant flow path.

FIG. 6 illustrates a first modified example of the coolant flow paths 15. In the first modified example illustrated in FIG. 6, the coolant flow paths 15 are illustrated in five levels running side-by-side from the CPU 7 side. In FIG. 6, in sequence from the CPU 7 side, the five levels of the coolant flow paths 15 are respectively labeled 15*a*, 15*b*, 15*c*, 15*d*, and 15*e*. In the first modified example illustrated in FIG. 6, the heights of the coolant flow paths 15 differ at each level. The heights of the coolant flow paths 15 gradually increase on progression from the coolant flow path 15*e* side to the coolant flow path 15*a* side. Due to the gradual increase in the heights of the coolant flow paths 15 on progression from the coolant flow path 15*e* side toward the coolant flow path 15*a* side, the effective cross-sectional areas of the coolant flow paths become larger the closer the level to the CPU 7.

In cases in which the coolant flow paths 15 (15*a* to 15*e*) are formed in this manner, the quantity of flow of coolant passing through each coolant flow path 15 varies according to the height of the coolant flow path 15. For example, of the coolant flow paths 15, coolant that has flowed out from the second headers 13*a* and has passed through the holes 14 more readily flows to the coolant flow path 15*a*, which has a comparatively large height, and less readily flows to the coolant flow path 15*e*, which has a comparatively small height. Thus, in cases in which the coolant flow paths 15 (15*a* to 15*e*) are formed as described above, a comparable amount, or a larger amount, of coolant flows through the coolant flow paths 15 on levels nearer the CPU 7 than the coolant flow paths 15 on levels further away from the CPU 7.

Figure 7:
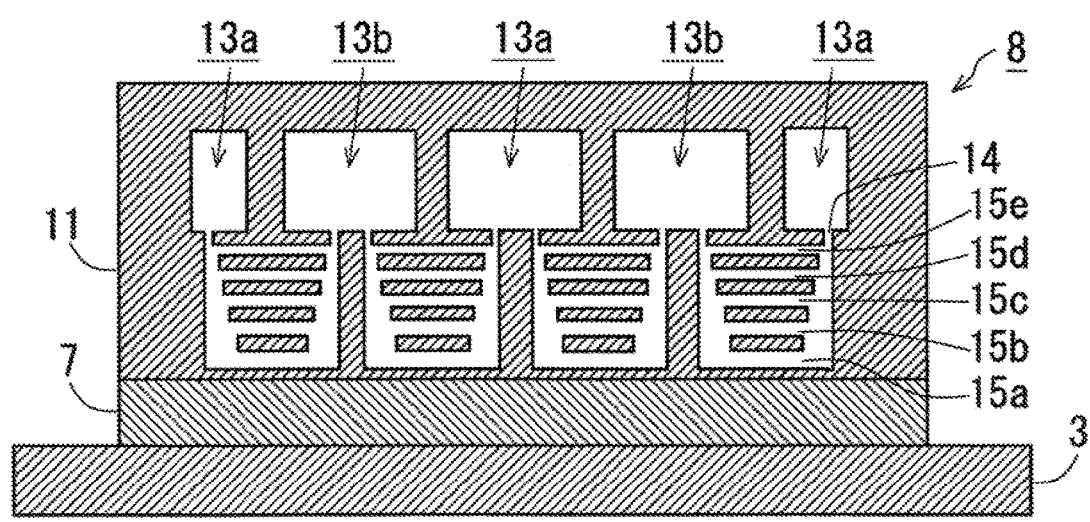
FIG. 7 illustrates a second modified example of a coolant flow path.

FIG. 7 illustrates a second modified example of the coolant flow paths 15. Similarly to in the first modified example illustrated in FIG. 6, in the second modified example illustrated in FIG. 7 the coolant flow paths 15 are illustrated in five levels running side-by-side from the CPU 7 side. However, in the second modified example of the coolant flow paths 15 illustrated in FIG. 7, the sizes of the inlet and outlet portion of the coolant flow paths 15 differ at each level. The size of the inlet and outlet portions for coolant at each side of the coolant flow paths 15 gradually increases on progression from the coolant flow path 15*e* side toward the coolant flow path 15*a* side. Due to the gradual increase in the sizes of the inlet and outlet portions of the coolant flow paths 15 on progression from the coolant flow path 15*e* side toward the coolant flow path 15*a* side, the effective cross-sectional areas of the coolant flow paths become larger the closer the level to the CPU 7.

In cases in which the coolant flow paths 15 (15*a* to 15*e*) are formed in this manner, the quantity of flow of coolant passing through each coolant flow path 15 varies according to the size of the inlet and outlet portion of the coolant flow path 15. For example, of the coolant flow paths 15, coolant that has flowed out from the second headers 13*a* and has passed through the holes 14 more readily flows to the coolant flow path 15*a*, which has comparatively large sized inlet and outlet portions, and less readily flows to the coolant flow path 15*e*, which has comparatively small sized inlet and outlet portions. Thus, in cases in which the coolant flow paths 15 (15a to 15e) are formed as described above, a comparable amount, or a larger amount, of coolant flows through the coolant flow paths 15 on levels nearer the CPU 7 than the coolant flow paths 15 on levels further away from the CPU 7.

Note that the configuration of the coolant flow paths 15 is not limited to a configuration in which the cross-sectional areas of the levels are the same as illustrated in FIG. 4, the configuration of the first modified example illustrated in FIG. 6, or the configuration of the second modified example illustrated in FIG. 7.

The coolant flow paths 15 may, for example, have a configuration that combines elements of the first modified example illustrated in FIG. 6 with elements of the second modified example illustrated in FIG. 7. Namely, the coolant flow paths 15 may, for example, be configured such that the heights of the coolant flow paths 15 gradually increase on progression from the coolant flow path 15e side toward the coolant flow path 15a side, and such that the sizes of the inlet and outlet portions of the coolant flow paths 15 gradually increase on progression from the coolant flow path 15e side toward the coolant flow path 15a side.

Further, the coolant flow paths 15 may, for example, be configured such that the sizes of the inlet portions of the coolant flow paths 15 gradually increase on progression from the coolant flow path 15e side toward the coolant flow path 15a side, and such that the sizes of the outlet portions of the coolant flow paths 15 are the same from the coolant flow path 15a to the coolant flow path 15e. Further, the coolant flow paths 15 may, for example, be configured such that the sizes of the outlet portions of the coolant flow paths 15 gradually increase on progression from the coolant flow path 15e side toward the coolant flow path 15a side, and the sizes of the inlet portions of the coolant flow paths 15 are the same from the coolant flow path 15a to the coolant flow path 15e.

Moreover, the coolant flow paths 15 may, for example, be configured such that instead of the heights of the coolant flow paths 15 and the sizes of the inlet and outlet portions of the coolant flow paths 15 being the same from coolant flow path 15a to coolant flow path 15e, an orifice or some other flow quantity regulation unit may be provided to each level of the coolant flow paths 15 such that the effective cross-sectional areas thereof become greater the closer the level to the CPU 7.

Figure 8:
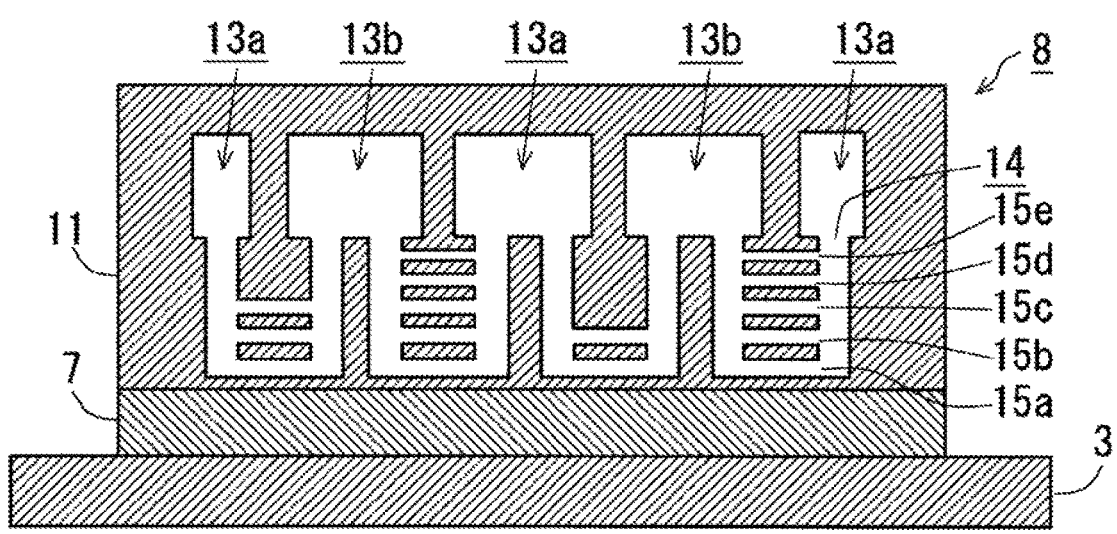
FIG. 8 illustrates a third modified example of a coolant flow path.

FIG. 8 illustrates a third modified example of the coolant flow paths 15. As illustrated in FIG. 8, the cooling plate 8 may, for example, be configured such that the number of levels of coolant flow paths 15 varies depending on location, or such that the effective cross-sectional areas of coolant flow paths 15 at given locations are the same at each level. In cases in which the amount of heat generated by the CPU 7 varies by location, providing a number of levels of coolant flow paths 15 in accordance with the amount of heat generated at each location enables the CPU 7 to be cooled to an even temperature overall.

The efficacy of the exemplary embodiment and each modified example above was investigated, and the results of these investigations are as given below. For these investigations, a coolant flow path 15 with a single level was employed as a reference for comparison (referred to hereafter as a "comparative example"). In these investigations, the cooling plates 8 had a lateral width of approximately 20 mm, the cooling plates 8 had a height of approximately 5 mm, and the coolant flow paths 15 had a height no more than approximately 0.5 mm.

Figure 9:
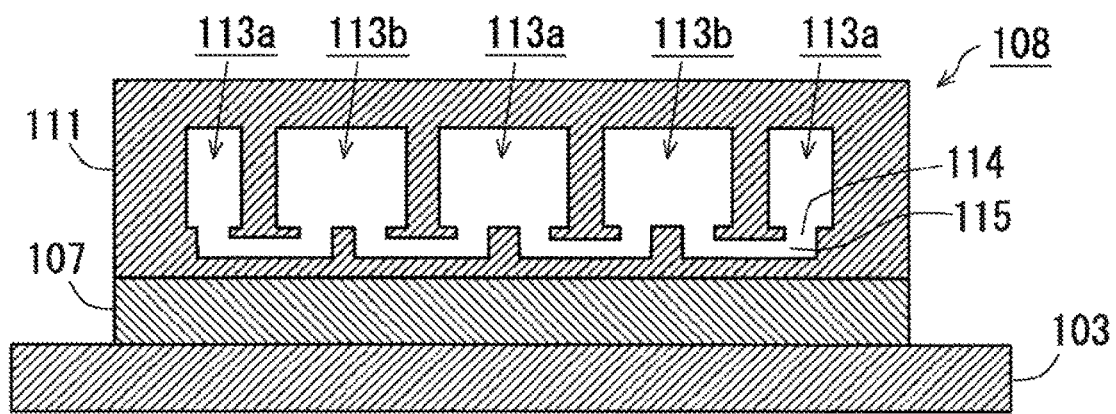
FIG. 9 illustrates a comparative example.

FIG. 9 illustrates the comparative example. The cooling plate 108 of the comparative example is attached to the surface of a CPU 107 mounted on a wiring board 103 similarly to the cooling plate 8 above. Second headers 113a, 113b, holes 114, and coolant flow paths 115 are provided within a plate 111 that forms the relevant portion of the cooling plate 108.

Figure 10:
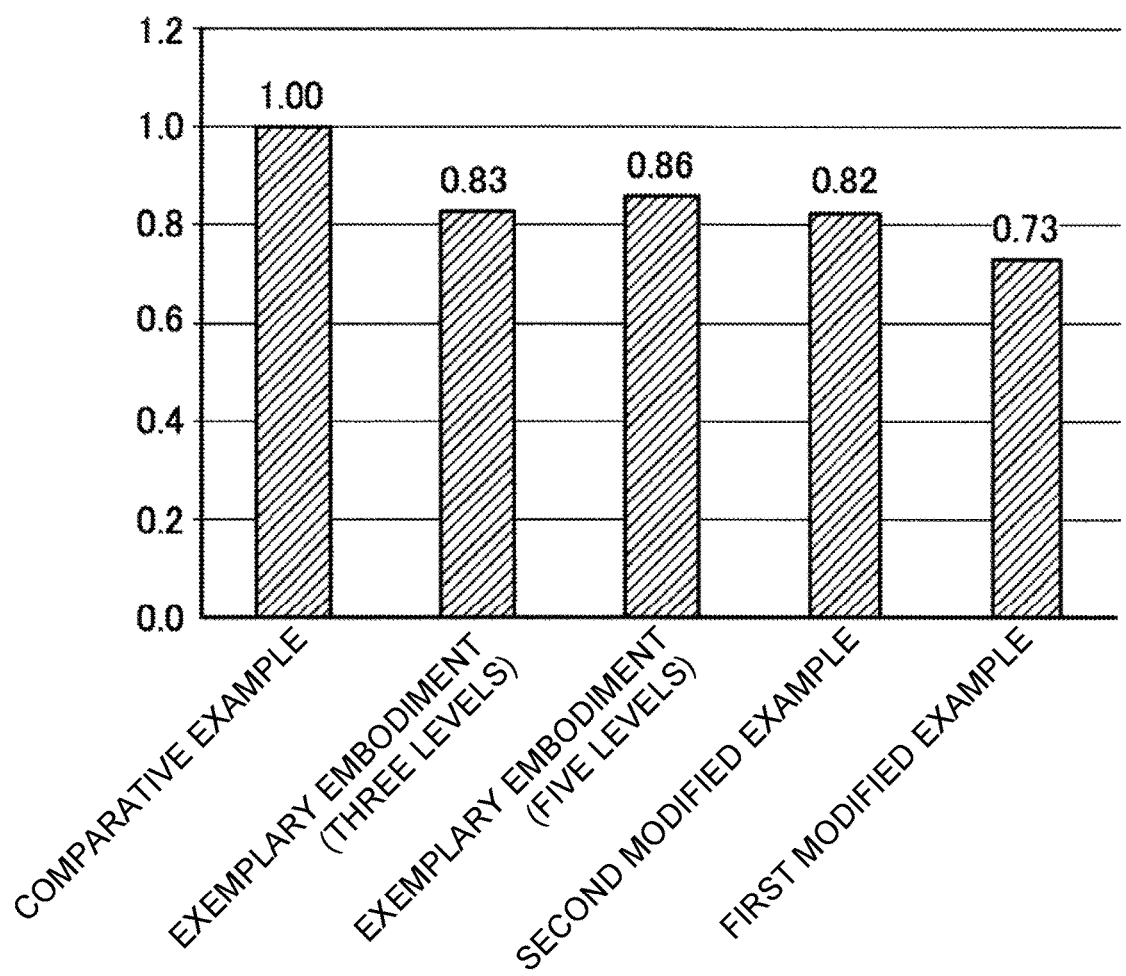
FIG. 10 is a graph illustrating thermal resistance reduction effects of cooling plates corresponding to the exemplary embodiment, modified examples, and comparative example mentioned above.

FIG. 10 is a graph illustrating thermal resistance reduction effects in the exemplary embodiment (two configurations thereof, with three and five levels of coolant flow paths 15 respectively), the first modified example, the second modified example, and the comparative example. As is readily apparent in the graph of FIG. 10, the exemplary embodiment, the first modified example, and the second modified example have less thermal resistance in their respective heat transfer paths from the heat generating element to the coolant than in the comparative example. In particular, the first modified example illustrated in FIG. 6 exhibits a considerable decrease in thermal resistance compared to the comparative example.

The results of these investigations confirmed that providing coolant flow paths 15 in plural levels within the plate 11 enables the CPU 7 to be more effectively cooled than when only one coolant flow path 15 level was provided. Further, the results of these investigations confirmed that configuring the inside of the plate 11 such that a comparable amount, or an larger amount, of coolant flows through coolant flow paths 15 on levels nearer the CPU 7 than coolant flow paths 15 on levels further away from the CPU 7 enables the CPU 7 to be effectively cooled.

Supplementary explanation follows regarding configuration of the coolant flow paths 15.

Figure 11:
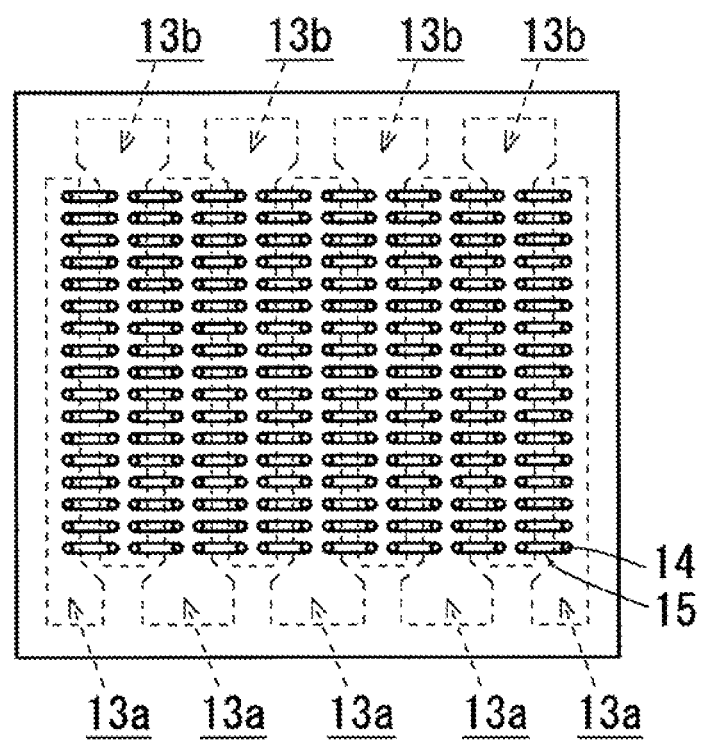
FIG. 11 is a first diagram illustrating a coolant flow path as seen along a direction orthogonal to a plate face of the plate.
Figure 12:
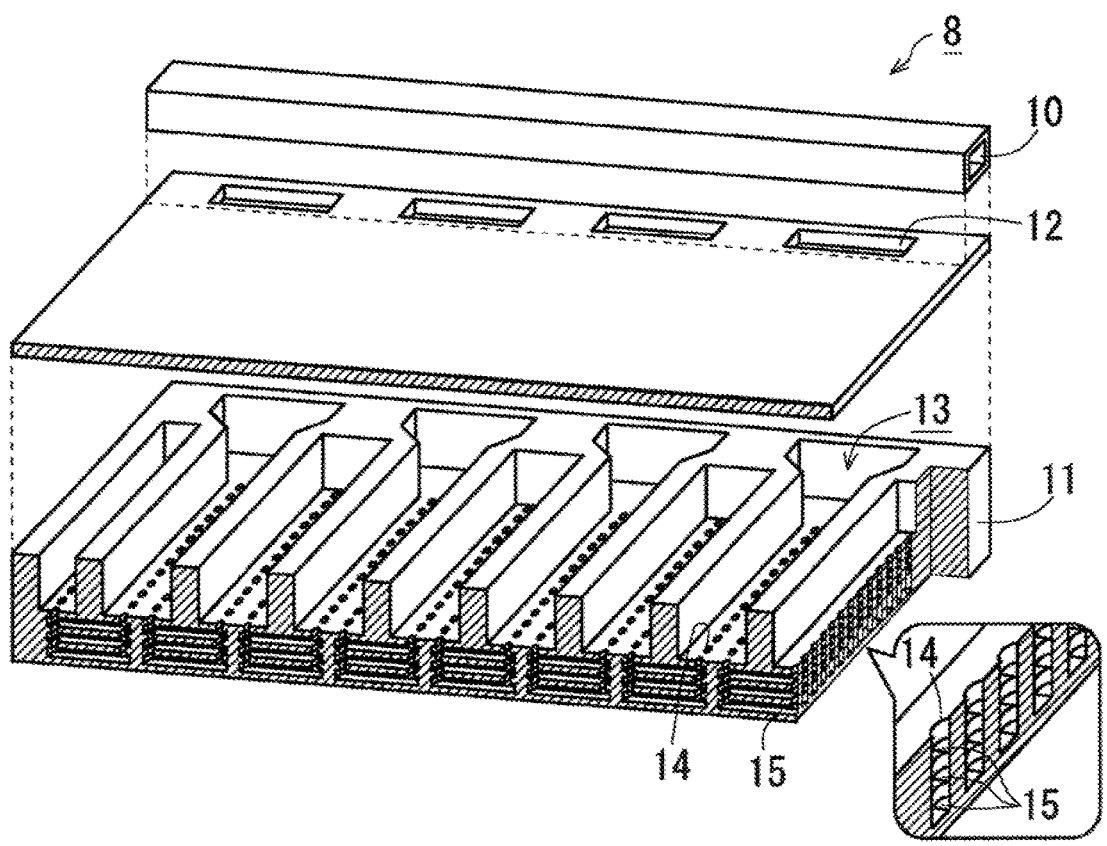
FIG. 12 is a diagram further illustrating the coolant flow path embodiment illustrated in FIG. 11.

FIG. 11 is a first diagram illustrating coolant flow paths 15 as seen along a direction orthogonal to a plate face of the plate 11. FIG. 12 is a diagram further illustrating the coolant flow paths 15 illustrated in FIG. 11. As illustrated in FIG. 11 and FIG. 12, each coolant flow path 15 may, for example, be formed as a flow path that links one hole 14 in a second header 13a to one hole 14 in a second header 13b.

Figure 13:
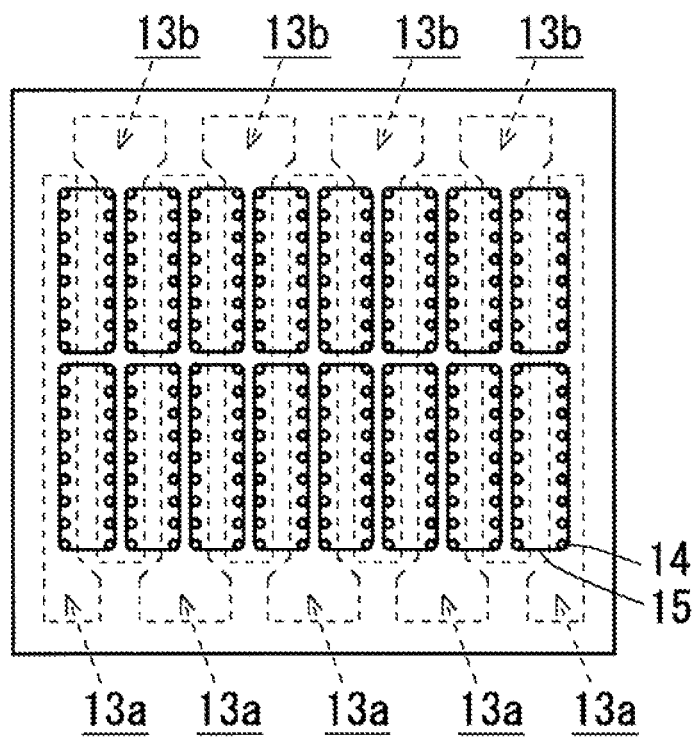
FIG. 13 is a second diagram illustrating a coolant flow path as seen along a direction orthogonal to a plate face of a plate.

FIG. 13 is a second diagram illustrating coolant flow paths 15 as seen along a direction orthogonal to a plate face of the plate 11. As illustrated in FIG. 13, the coolant flow paths 15 may, for example, be formed as flow paths that link a number of holes 14 in a second header 13a to a number of holes 14 in a second header 13b together in groups.

Figure 14:
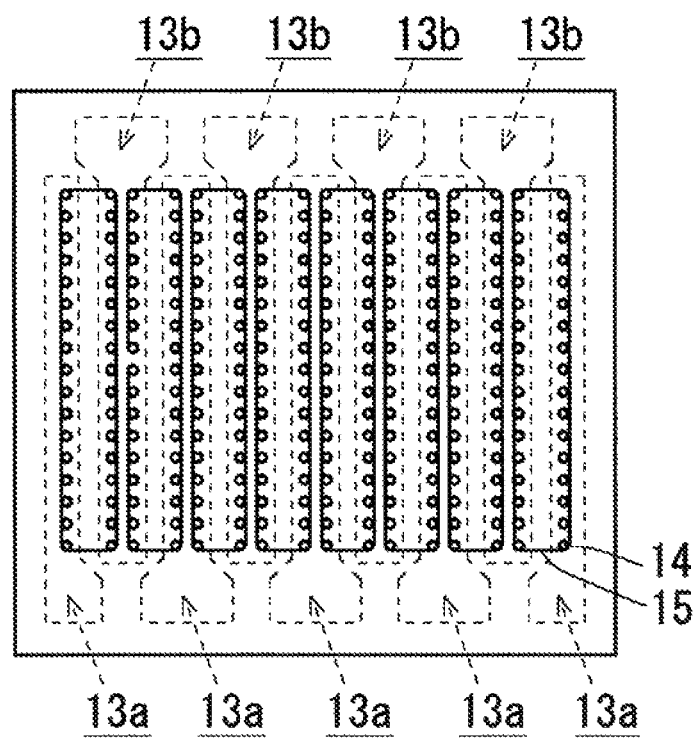
FIG. 14 is a third diagram illustrating a coolant flow path as seen along a direction orthogonal to a plate face of a plate.

FIG. 14 is a third diagram illustrating coolant flow paths 15 as seen along a direction orthogonal to a plate face of the plate 11. As illustrated in FIG. 14, the coolant flow paths 15 may, for example, be formed as flow paths linking holes 14 in a second header 13a to holes 14 in a second header 13b together as a group.

With coolant flow paths 15 configured as illustrated in any of FIG. 11 to FIG. 14, the cooling plate 8 is capable of effectively cooling the CPU 7.

In a cooling plate through which coolant flows, heat from a heat generating element in contact with the cooling plate is transmitted to the coolant through the components of the cooling plate. In order to efficiently remove heat from the heat generating element, it is thus desirable to increase the contact area between the coolant and the components forming the cooling plate as much as possible. However, there is a concern that attempts to increase contact area within the cooling plate through miniaturization of the inner faces of the cooling plate may, due to limitations in manufacturing technology, be unable to achieve sufficient miniaturization, or may otherwise lead to increased manufacturing costs.

One conceivable way to increase contact area within the cooling plate is, for example, to adopt an internal structure in which corrugated fin-shaped members or the like are stacked in plural levels. However, heat from a heat generating element causes the temperature of coolant flowing through such a cooling plate to gradually increase as it progresses from upstream to downstream. In a cooling plate with an internal structure in which corrugated fin-shaped members or the like are stacked in plural layers, local imbalances in cooling ability within the plane making contact with the heat generating element are thus liable to occur. Accordingly, it is possible that sufficient cooling ability may not be exhibited even with a cooling plate with an internal structure in which corrugated fin-shape members or the like are stacked in plural layers.

A cooling plate discussed in the present disclosure improves cooling ability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling plate comprising:
   a plate that has a first surface and a second surface;
   a heat generating element attached to the first surface of the plate;
   feed flow paths and return flow paths for coolant that are alternatingly arranged along the second surface of the plate; and
   a plurality of coolant flow paths formed within the plate, each of which paths is positioned at a plurality of levels along a direction from the second surface to the first surface, closer to the heat generating element than the feed flow paths and the return flow paths, the plurality of coolant flow paths communicating in parallel through each of the coolant flow paths of each level between adjacent paths of the feed flow paths and the return flow paths, wherein each of the coolant flow paths is separated from the other coolant flow paths by a wall.

2. The cooling plate of claim 1, wherein a cross-sectional area of each of the plurality of coolant flow paths becomes greater the closer the levels get to the heat generating element.

3. The cooling plate of claim 1, wherein a height of each of the coolant flow paths becomes greater as the levels get closer to the heat generating element.

4. The cooling plate of claim 1, wherein a size of each of inlets and outlets of the coolant flow paths becomes greater as the levels get closer to the heat generating element.

5. The cooling plate of claim 1, wherein a number of levels of the coolant flow paths varies according to a location on the heat generating element.

6. An information processing device comprising:
   a heat generating element; and
   a cooling plate including
      a plate that has a first surface and a second surface;
      a heat generating element attached to the first surface of the plate;
      feed flow paths and return flow paths for coolant that are alternatingly arranged along the second surface of the plate; and
      a plurality of coolant flow paths formed within the plate, each of which paths is positioned at a plurality of levels along a direction from the second surface to the first surface, closer to the heat generating element than the feed flow paths and the return flow paths, the plurality of coolant flow paths communicating in parallel through each of the coolant flow paths of each level between adjacent paths of the feed flow paths and the return flow paths, wherein each of the coolant flow paths is separated from the other coolant flow paths by a wall.

7. The information processing device of claim 6, wherein a cross-sectional area of each of the plurality of coolant flow paths becomes greater the closer the levels get to the heat generating element.

8. The information processing device of claim 6, wherein a height of each of the coolant flow paths becomes greater as the levels get closer to the heat generating element.

9. The information processing device of claim 6, wherein a size of each of inlets and outlets of the coolant flow paths becomes greater as the levels get closer to the heat generating element.

10. The information processing device of claim 6, wherein a number of levels of the coolant flow paths varies according to a location on the heat generating element.

* * * * *